(12) United States Patent
Van Der Heijden et al.

(10) Patent No.: US 8,394,572 B2
(45) Date of Patent: Mar. 12, 2013

(54) METHOD OF PREPARING A SUBSTRATE FOR LITHOGRAPHY, A SUBSTRATE, A DEVICE MANUFACTURING METHOD, A SEALING COATING APPLICATOR AND A SEALING COATING MEASUREMENT APPARATUS

(75) Inventors: Marcus Theodoor Wilhelmus Van Der Heijden, Dilsen-Stokkem (BE); Marco Koert Stavenga, Eindhoven (NL); Patrick Wong, Schilde (BE); Frederik Johannes Van Den Bogaard, Eindhoven (NL); Dirk De Vries, Eindhoven (NL); David Bessems, Eindhoven (NL); Jacques Roger Alice Mycke, Maastricht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/361,645

(22) Filed: Jan. 30, 2012

(65) Prior Publication Data

US 2012/0129098 A1    May 24, 2012

Related U.S. Application Data

(63) Continuation of application No. 12/289,919, filed on Nov. 6, 2008, now Pat. No. 8,114,568.

(60) Provisional application No. 60/996,204, filed on Nov. 6, 2007, provisional application No. 61/071,362, filed on Apr. 24, 2008.

(51) Int. Cl.
*G03F 7/00* (2006.01)
*G03F 7/004* (2006.01)
*G03F 7/11* (2006.01)

(52) U.S. Cl. .............. 430/270.1; 430/271.1; 430/273.1; 430/311

(58) Field of Classification Search ............... 430/270.1, 430/273.1, 271.1, 311
See application file for complete search history.

(56) References Cited

U.S. PATENT DOCUMENTS

| | | | |
|---|---|---|---|
| 4,509,852 A | 4/1985 | Tabarelli et al. | |
| 6,558,877 B1 | 5/2003 | Ishikawa et al. | |
| 7,563,042 B2 | 7/2009 | Nakaharada et al. | |
| 7,630,053 B2 | 12/2009 | Kawamura | |
| 7,643,127 B2 | 1/2010 | Baselmans et al. | |
| 7,687,227 B2 | 3/2010 | Shiobara et al. | |
| 7,884,062 B2 | 2/2011 | Koshiyama et al. | |
| 7,914,972 B2 | 3/2011 | Fujiwara et al. | |
| 8,114,568 B2 * | 2/2012 | Van Der Heijden et al. | 430/270.1 |
| 2004/0136494 A1 | 7/2004 | Lof et al. | |
| 2004/0191479 A1 | 9/2004 | Hatakeyama et al. | |
| 2004/0207824 A1 | 10/2004 | Lof et al. | |

(Continued)

FOREIGN PATENT DOCUMENTS

| EP | 1 420 300 A2 | 5/2004 |
|---|---|---|
| EP | 1 783 823 | 5/2007 |

(Continued)

OTHER PUBLICATIONS

Australian Written Opinion mailed Sep. 28, 2009 in relatd application No. SG 200808313-1.

(Continued)

*Primary Examiner* — Amanda C. Walke
(74) *Attorney, Agent, or Firm* — Pillsbury Winthrop Shaw Pittman LLP

(57) ABSTRACT

A substrate for use in a lithographic projection apparatus. The substrate includes a sealing coating that covers at least a part of a first interface between two layers on the substrate, or between a layer and the substrate, and does not extend to a central portion of the substrate.

20 Claims, 8 Drawing Sheets

U.S. PATENT DOCUMENTS

| | | |
|---|---|---|
| 2005/0186516 A1 | 8/2005 | Endo et al. |
| 2006/0177776 A1 | 8/2006 | Matsunaga et al. |
| 2007/0042297 A1 | 2/2007 | Shiobara et al. |
| 2007/0196774 A1 | 8/2007 | Fujiwara et al. |
| 2007/0229789 A1 | 10/2007 | Kawamura |
| 2008/0241489 A1 | 10/2008 | Ishibashi et al. |

FOREIGN PATENT DOCUMENTS

| | | |
|---|---|---|
| EP | 1 804 279 A1 | 7/2007 |
| EP | 1 898 448 A1 | 3/2008 |
| EP | 1 975 719 | 10/2008 |
| JP | 2005-175079 | 6/2005 |
| JP | 2006-189687 | 7/2006 |
| JP | 2007-067303 | 3/2007 |
| JP | 2007-227645 | 9/2007 |
| JP | 2007-266074 | 10/2007 |
| JP | 2008-130789 | 6/2008 |
| JP | 2008-277748 | 11/2008 |
| WO | WO 99/49504 A1 | 9/1999 |
| WO | 2006/009169 | 1/2006 |

OTHER PUBLICATIONS

Korean Office Action dated Sep. 27, 2010 in related Korean application No. 10-2008-0109921.

Japanese Office Action mailed Apr. 12, 2011 in corresponding Japanese Patent Application No. 2008-282841.

Japanese Office Action mailed Sep. 15, 2011 in corresponding Japanese Patent Application No. 2008-282841.

* cited by examiner

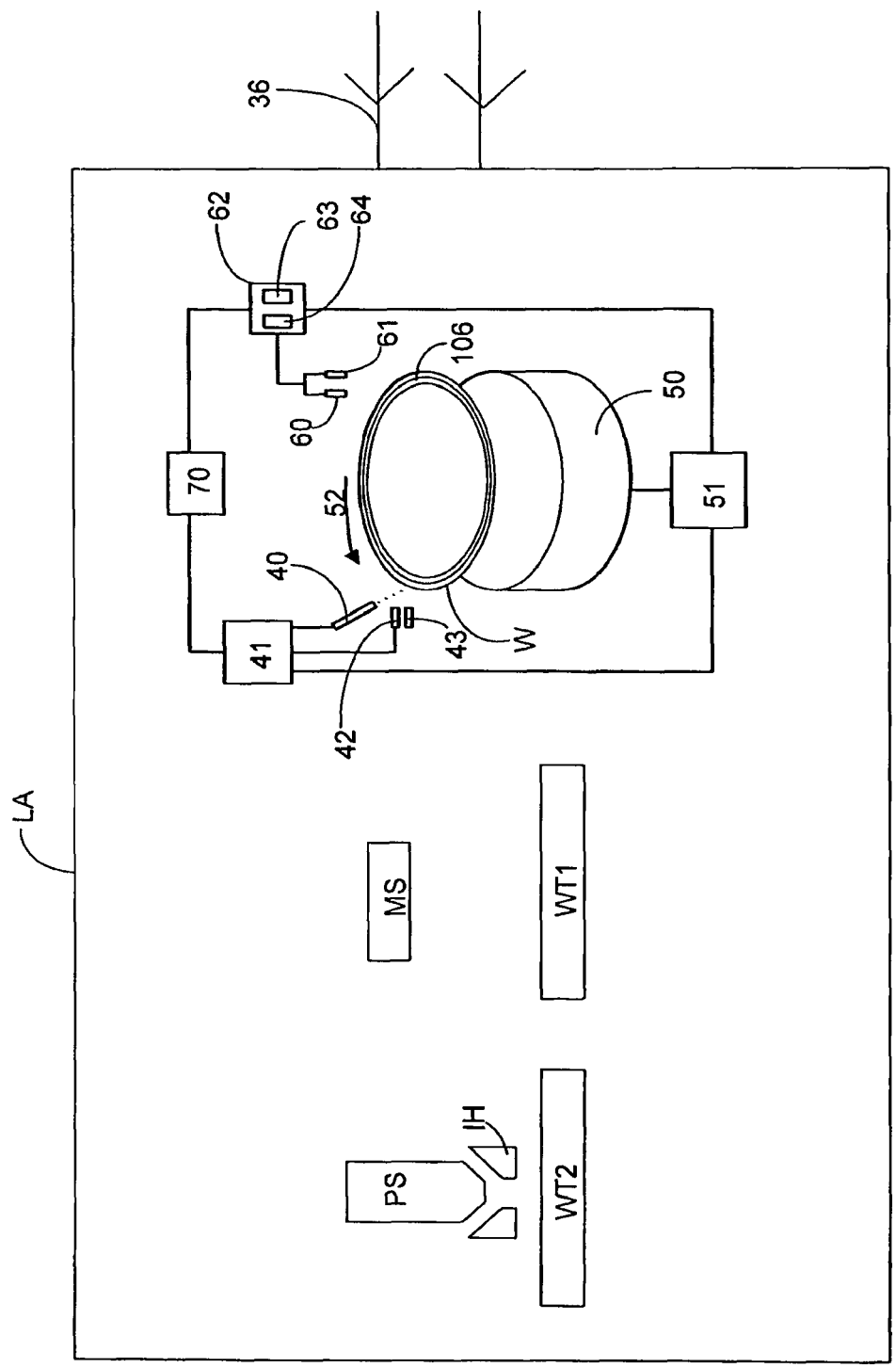

METHOD OF PREPARING A SUBSTRATE FOR LITHOGRAPHY, A SUBSTRATE, A DEVICE MANUFACTURING METHOD, A SEALING COATING APPLICATOR AND A SEALING COATING MEASUREMENT APPARATUS

This application is a continuation of U.S. patent application Ser. No. 12/289,919, filed Nov. 6, 2008, now U.S. Pat. No. 8,114,568, which application claims priority and benefit under 35 U.S.C. §119(e) to U.S. Provisional Patent Application No. 60/996,204, filed Nov. 6, 2007 and to U.S. Provisional Patent Application No. 61/071,362, filed Apr. 24, 2008. The foregoing applications are incorporated herein in their entirety by reference.

FIELD

The present invention relates to a method of preparing a substrate for lithography, a substrate, a device manufacturing method, a sealing coating applicator and a sealing coating measurement apparatus.

BACKGROUND

A lithogaphic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, preferably a higher refractive index than water. Fluid excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g., particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the solutions proposed is for a liquid supply system to provide liquid on only a localized area of the substrate and in between the final element of the projection system and the substrate using a liquid confinement system or structure (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system PL. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet IN with an outlet OUT on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system PL in the XY plane though there may be some relative movement in the Z direction (in the direction of the optical axis). In an embodiment, a seal is formed between the liquid confinement structure and the surface of the substrate W and may be a contactless seal such as a gas seal.

The liquid confinement structure 12 at least partly contains liquid in the space 11 between a final element of the projection system PL and the substrate W. A contactless seal, such as a gas seal 16, to the substrate W may be formed around the image field of the projection system PL so that liquid is confined within the space 11 between the substrate surface and the final element of the projection system PL. The space 11 is at least partly formed by the liquid confinement structure 12 positioned below and surrounding the final element of the projection system PL. Liquid is brought into the space 11 below the projection system PL and within the liquid confinement structure 12 by liquid inlet 13 and may be removed by liquid outlet 13. The liquid confinement structure 12 may extend a little above the final element of the projection system PL and the liquid level rises above the final element so that a buffer of liquid is provided. The liquid confinement structure 12 has an inner periphery that at the upper end, in an embodiment, closely conforms to the shape of the projection system PL or the final element thereof and may, e.g., be round. At the bottom, the inner periphery closely conforms to the shape of the image field, e.g., rectangular though this need not be the case.

The liquid is contained in the space 11 by the gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas, provided under pressure via inlet 15 to the gap between liquid confinement structure 12 and substrate W and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas is effective to contain the liquid in the space 11. Such a system is disclosed in United States patent application publication no. US 2004-0207824.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Contamination of immersion liquid and/or a component, such as the substrate table or a liquid supply device in an immersion lithography apparatus, can be a particular problem. Any source of such contamination should be minimized or reduced.

SUMMARY

It is desirable, for example, to reduce the risk of contamination of immersion liquid and one or more components of a lithography apparatus.

According to an aspect of the invention, there is provided a substrate for use in a lithographic projection apparatus. The substrate includes a sealing coating that covers at least a part of a first interface between two layers on the substrate, or between a layer and the substrate, and does not extend to a central portion of the substrate.

According to an aspect of the invention, there is provided a method of preparing a substrate for lithography. The method includes applying one or more layers on the substrate, and applying a sealing coating to cover at least a part of an interface between two layers on the substrate, or between a layer and the substrate, without extending to a central portion of the substrate.

According to an aspect of the invention, there is provided a device manufacturing method. The method includes applying a sealing coating to cover at least a part of an interface between two layers on a substrate, or between a layer and the substrate, without extending to a central portion of the substrate. The method also includes projecting a patterned beam of radiation onto a target portion of the substrate.

According to an aspect of the invention, there is provided a substrate for use in a lithographic projection apparatus. The substrate comprises a sealing coating that covers at least a part of an interface between a layer and the substrate. The sealing coating extends to the edge of the substrate. The sealing coating may comprise resist.

According to an aspect of the invention, there is provided a method of preparing a substrate for lithography. The method may comprise applying a layer on the substrate. The method may comprise applying a sealing coating to cover at least a part of an interface between the layer and the substrate, the sealing coating extending to an edge of the substrate.

According to an aspect of the invention, there is provided device manufacturing method. The device manufacturing method may comprise applying a sealing coating to cover at least a part of an interface between a layer and the substrate, the sealing coating extending to an edge of the substrate. A patterned beam of radiation may be projected onto a target portion of the substrate.

According to an aspect of the invention, there is provided a sealing coating applicator to apply a sealing coating to cover at least a part of an interface between a substrate and a layer on the substrate such that the sealing coating extends to an edge of the substrate, the sealing coating applicator comprising: a jet to dispense a non-continuous flow of fluid to form the sealing coating; and a substrate handler to move the substrate.

According to an aspect of the invention, there is provided a sealing coating measurement apparatus to detect presence of and/or a defect in a sealing coating of a substrate, the sealing coating measurement apparatus comprising: a detector to detect radiation reflected by the sealing coating; and a substrate handler to move the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 18 depicts, in cross-section, a sealing coating applicator and a sealing coating measurement apparatus in accordance with an embodiment of the invention.

DETAILED DESCRIPTION

Figure 1:
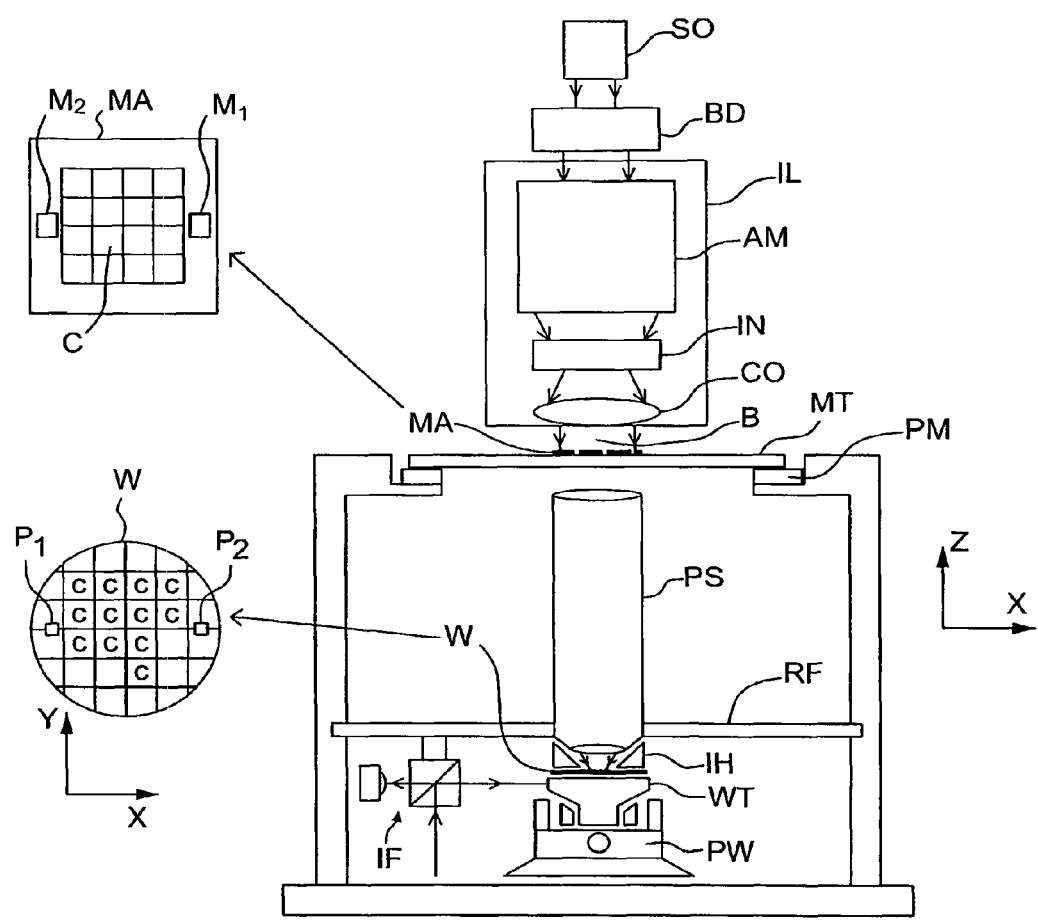
FIG. 1 depicts a lithographic apparatus according to an embodiment of the invention.
Figure 2:
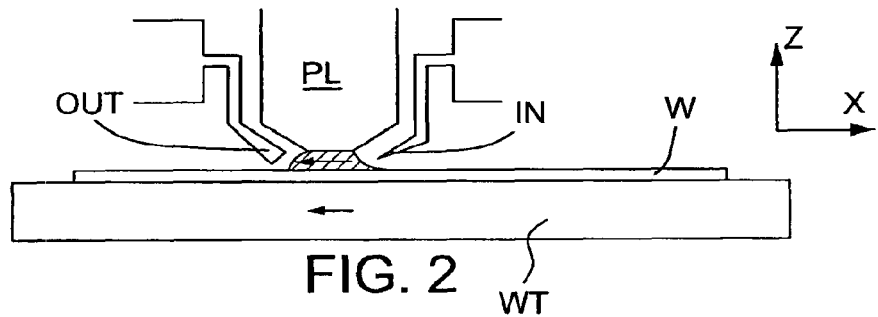
FIG. 2 depicts a liquid supply system for use in a lithographic projection apparatus.
Figure 3:
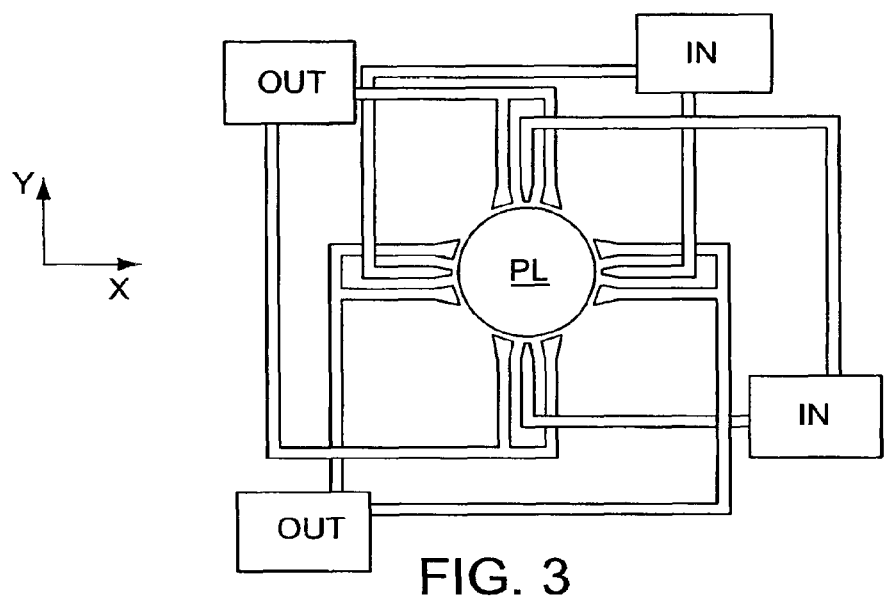
FIG. 3 depicts a liquid supply system for use in a lithographic projection apparatus.
Figure 4:
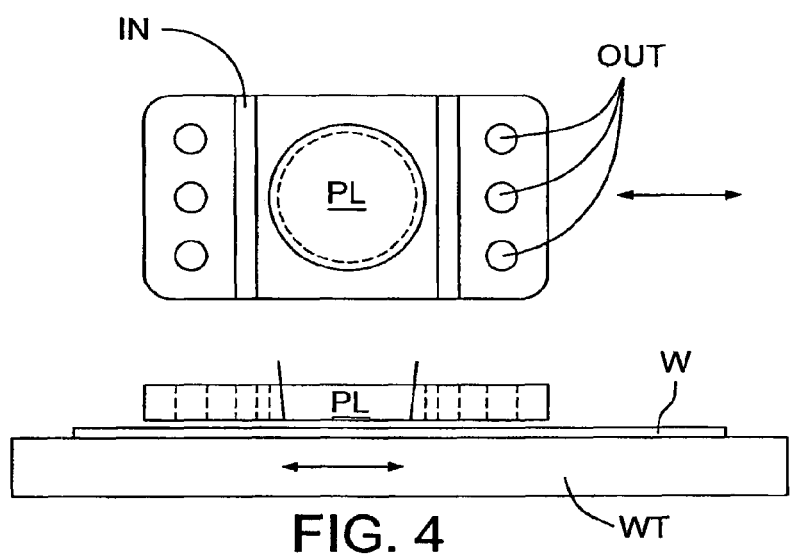
FIG. 4 depicts a liquid supply system for use in a lithographic projection apparatus.
Figure 5:
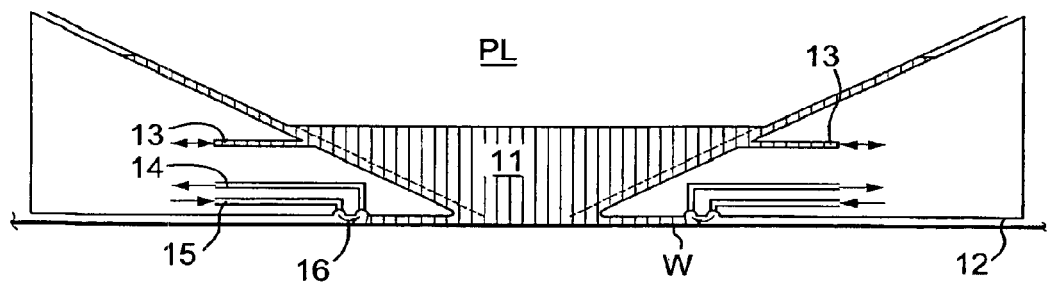
FIG. 5 depicts a further liquid supply system.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system being supported by frame RF.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions C, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

During immersion lithography, liquid comes into contact with the coating(s) on the top surface of the substrate. A potential problem is that liquid may creep between a plurality of layers or between a layer and the substrate. This can lead to flaking off of the layer(s). This may result in contamination of the immersion liquid. The flakes may lead to an imaging error and/or damage to the substrate and/or a component of the immersion apparatus. Flaking off of the edge of a layer may also result in difficulty with etching of the substrate.

A bottom anti-reflection coating (BARC) typically has excellent adhesion on a silicon substrate. If a resist layer (i.e. a radiation sensitive layer) or topcoat layer is on the BARC layer, good adhesion is typically present. Unfortunately, during processing, the topcoat and/or resist layer may sometimes extend over the BARC layer onto the substrate. This problem can be mitigated by inspecting the edge of each substrate prior to use and rejecting a substrate where this is detected.

Figure 6:
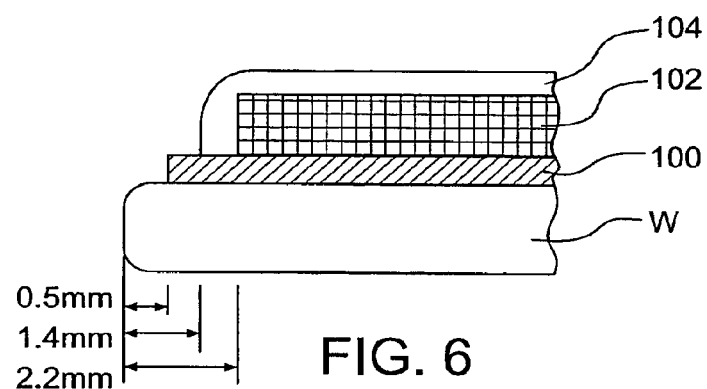
FIG. 6 depicts, in cross-section, a substrate with three coatings thereon.

FIG. 6 shows the edge of a substrate in which neither the resist nor the topcoat overlap the edge of the BARC layer.

In FIG. 6, a BARC layer 100 is first coated on the substrate W. The BARC layer 100 has an edge which extends close to the edge of the substrate. The gap between the edge of the substrate and the edge of the BARC layer may be less than 1.0 mm, such as approximately 0.5 mm. The substrate may be circular. This helps the spin coating of the various layers.

On top of the BARC layer 100 there is formed a resist layer 102. The resist layer 102 has an edge which is situated radially inwardly of the edge of the BARC layer 100. In the illustrated embodiment, the edge of the resist layer is about 2.2 mm from the edge of the substrate. On top of the resist layer is a topcoat layer 104. This layer is coated after the resist 102 layer has been deposited. As can be seen, the topcoat layer 104 covers the whole of the resist layer 102 as well as the edge of the resist layer 102 such that part of the topcoat layer 104 is deposited on top of the BARC layer 100. An edge of the topcoat layer 104 lies, radially, between the edge of the BARC layer 100 and the edge of the resist layer 102 and for example about 1.4 mm from the edge of the substrate W. Alternative arrangements are possible. In an embodiment, the topcoat and resist do not land on the substrate and the gap to the edge of the substrate is small (as small as possible). Any or all edge bead removal (EBR) strategies may be used in an embodiment of the present invention.

Embodiments of the present invention need not have the arrangement described in FIG. 6. In an embodiment of the present invention, referring to FIG. 7, a sealing coating 106 is used. The sealing coating 106 covers at least a part of an interface between two layers 100, 102, 104 on a substrate W or between a layer 100, 102, 104 and the substrate W. An interface is the line defining a position at which one layer changes to another layer. The sealing coating does not extend to a central portion of the substrate (i.e. where devices are imaged). The sealing coating 106 is therefore annular and only covers the edge of the layer(s) 100, 102, 104 applied to the substrate W. The topcoat, resist and BARC layers do extend to a central portion of the substrate. For example, the sealing coating may only be up to a few mm wide. For example, the sealing coating may be between 0.0 and 10 mm wide, desirably 0.0-2 mm wide. That is, the sealing coating is only present in an edge portion of the substrate. The width of the edge portion of the substrate where the sealing coating is present may only be about 1-5% of the width (e.g., diameter) of the substrate W. The sealing coating is desirably transparent to the radiation from the beam B. This is particularly so in the case where the sealing coating is wide.

Figure 7:
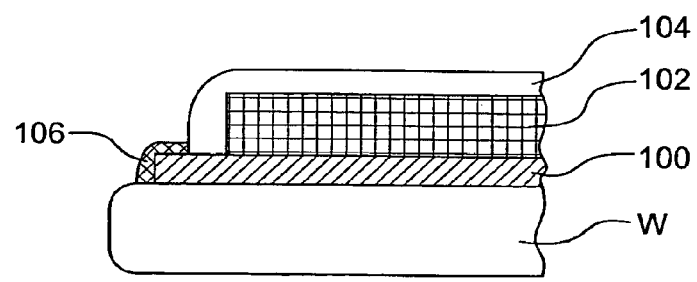
FIG. 7 depicts, in cross-section, a substrate in accordance with an embodiment of the invention.
Figure 9:
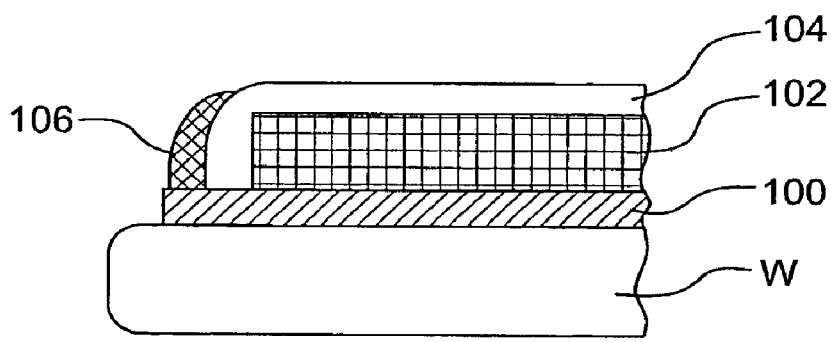
FIG. 9 depicts, in cross-section, a substrate in accordance with an embodiment of the invention.
Figure 10:
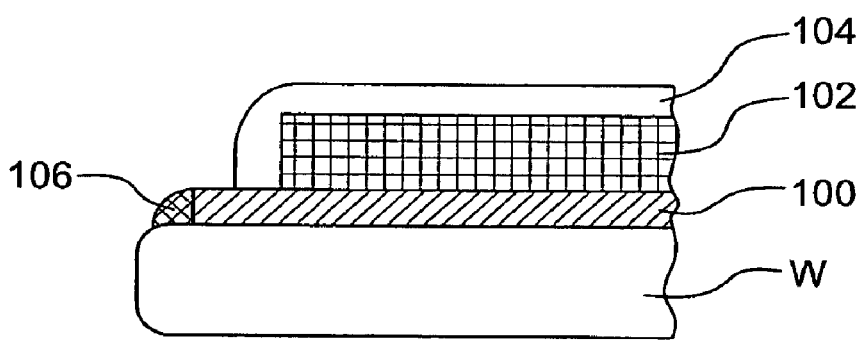
FIG. 10 depicts, in cross-section, a substrate in accordance with an embodiment of the invention.

In an embodiment, the sealing coating 106 may cover all interfaces between different layers and between a layer and the substrate. This is illustrated in FIG. 7. However, the use of a sealing coating 106 may be useful even if it only covers one interface. Such examples are illustrated in FIGS. 9 and 10.

Figure 8:
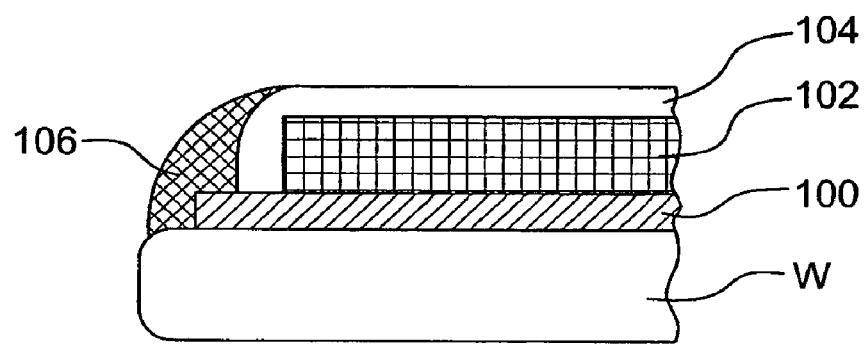
FIG. 8 depicts, in cross-section, a substrate in accordance with an embodiment of the invention.

The shape of the sealing coating, in cross-section, is not important. For example, the shape may be as is illustrated in FIG. 7 or as is illustrated in FIG. 8 or it may be different to how it is illustrated in those two Figures. The sealing coating may or may not extend to an edge of the substrate W. The sealing coating may or may not cover at least a portion of an edge surface of the substrate W. The sealing coating 106 may smooth the cross-section of the edge of the substrate W, which can help in promoting the flow of liquid over the edge of the substrate W in immersion lithogaphy. Aiding in the flow of liquid in this way may reduce the force of the liquid on the interface between layers and/or between a layer and the substrate and between the sealing coating and the substrate or a layer. This can help in preventing the above mentioned flaking.

A substrate according to an embodiment of the present invention may also be used in non-immersion lithography (i.e. dry lithography).

The material of the sealing coating desirably has good adhesion to at least one of: the material of the substrate, the material of the BARC, the material of the topcoat, the material of the resist. The material of the sealing coating is desirably inert to immersion liquid (which is often pure water but may be another fluid). The material of the sealing coating desirably has good adhesion to silicon. The material of the sealing coating is desirably resistant to UV radiation. The material of the sealing coating is desirably selectively removable from the material of the substrate and layer(s) to which it adheres. The material of the sealing coating may be applied by the same nozzle as that used for dispensing a solvent in chemical EBR.

For example, the sealing coating may be comprised of, for example, a conformal coating (acrylic or silicone based), topcoat or resist which has been modified (e.g. for improved adhesion) or primer. Types of material commonly used in automotive, aerospace or domestic fields may be appropriate. The listed materials, with the exception of primer, are lyophobic, that is hydrophobic for water. Liquid on a sealing coating made of such a material would have a receding contact angle in the range of 50 to 90 degrees, desirably more than 70 or 80 degrees and most desirably between 80 and 85 degrees. The advancing contact angle is in the range of 80 to 110 degrees, desirably 90 to 100 degrees and most desirably around 95 degrees. These contact angles are defined at normal operating temperatures and pressures in an immersion lithographic apparatus, which is generally 20 degrees Celsius.

The layers of FIG. 6 may be applied in the following way. First the BARC layer is applied to the substrate W. This can be done, for example, by spin coating. This is optionally followed by chemical EBR. Then a backside rinse (optionally with a solvent) of the substrate (i.e. the side of the substrate not covered by the BARC layer is washed) follows. The substrate is then placed on a hot plate. After that, the substrate is placed on a cold plate. The resist layer 102 is then applied, followed by chemical EBR, backside rinse, hot plate and cold plate as described above. Finally, the topcoat 104 is applied followed by chemical EBR, backside rinse, hot plate and cold plate. The topcoat 104 may be applied to the wet resist layer 102. In that case, after cure, the two coatings may form one layer.

In an embodiment, after applying of the topcoat 104 and chemical EBR, the sealing coating 106 is applied before the backside rinse, hot plate and cold plate. However, another methodology may be suitable. For example, the sealing coating may be applied at the end of the normal process. If the sealing coating is applied only on the interface between the substrate and the BARC 100, this could be done after the chemical EBR following BARC coating or prior to resist coating. As described above, the sealing coating can be applied through the same nozzle as used for solvent application during chemical EBR.

There is a difficulty with applying the sealing coating 106, for example, through the same nozzle as used for solvent application during chemical EBR. That is, splashing may occur due to the high spin speed of the substrate. Splashing can result in a large amount of material waste and thereby lower yield.

Another way in which the sealing coating 106 can be applied is using jetting technology. In jetting technology the substrate W is rotated and a jet dispenses small droplets which land on the edge of the substrate W and thereby form the sealing coating 106, when dried or cured. In an embodiment, material is jetted on the fly from a moving jet dispenser. Thus, the sealing coating 106 is applied through a non-continuous fluid flow. This compares, for example, to the application through the same nozzle as used for solvent application during chemical EBR which is based on a continuous flow. In an embodiment, the jet application may be similar to a computer printer which works on the ink jet printer principle, though that is not necessarily the case. Using jetting the substrate W is moved at a lower speed, e.g., rotated at a lower spin speed, than that used for chemical EBR. Therefore the risk of splashing is reduced. Jetting also allows better control of the process and the same material for the sealing coating 106 as described above can be used.

Figure 17:
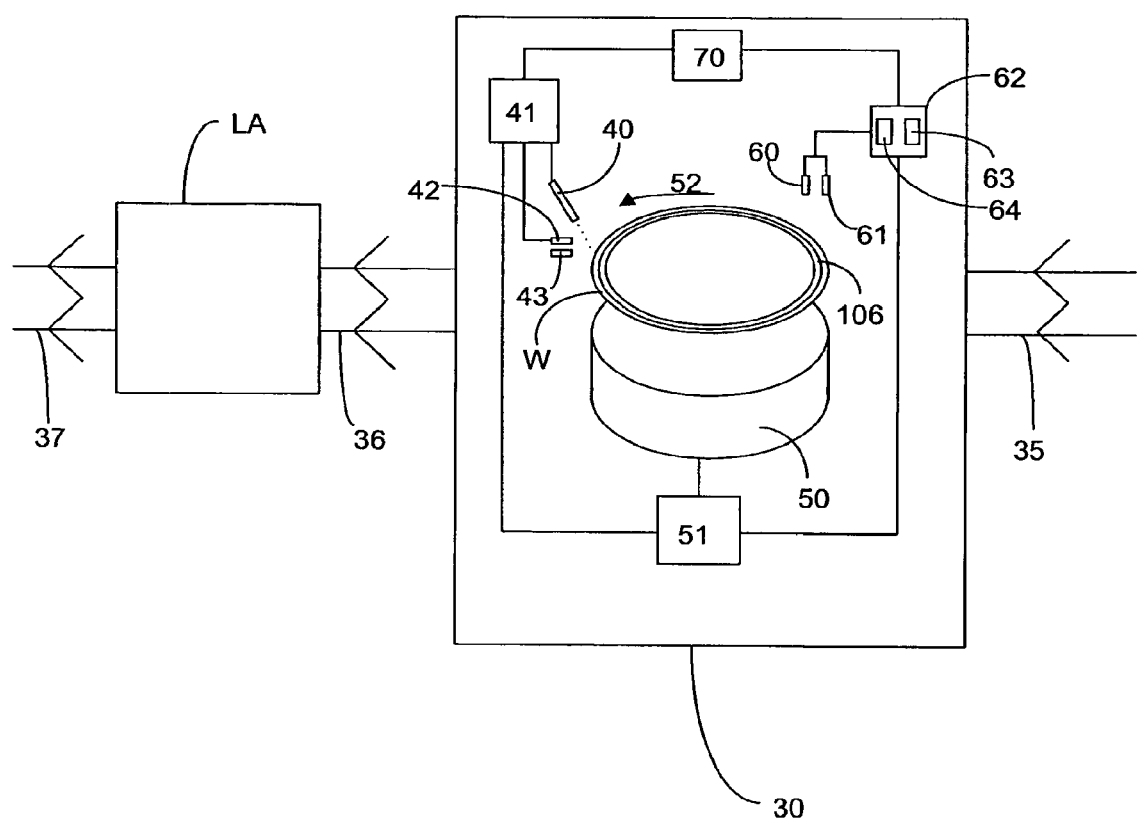
FIG. 17 depicts, in cross-section, a sealing coating applicator and a sealing coating measurement apparatus in accordance with an embodiment of the invention.

Any type of jetting nozzle may be used. For example, one or more piezoelectric or mechanical jets are suitable. A droplet size of between 150 μm and 400 μm, desirably between 200 μm and 300 μm is suitable. The substrate can be spun at one cycle every ½ to 5 seconds, desirably two seconds. The jet typically produces 50,000-200,000 droplets per hour. The apparatus may be provided with a sensor to detect whether droplets are being applied properly. Feedback from this sensor may be fed to a controller which may control the speed (e.g., spin speed) of the substrate W or a processing parameter of the jet accordingly. The sensor may comprise an optical detector, for example a video camera. FIGS. 17 and 18 described below illustrate such a system.

Other ways of applying the sealing coating 106 are brushing, needle dispensing with a continuous jet, etc. However, jetting technology is advantageous because of one or more of the following (or other) reasons. The jet can be placed in such a way (at an angle) that no material from the jet can find its way onto the under surface of the substrate W. This could be a difficulty with needle dispensation. No direct contact with the substrate W is required and this reduces the risk of cross contamination which is an issue with a brushing application of the sealing coating 106. Little material is used by jetting technology so that efficiency can be achieved through the use of a minimum amount of material. Because of the small amount of material used and the good control of the process, it may not be necessary to include a back side cleaning step of the substrate W. This further economizes on time and material. Jetting technology has a high degree of accuracy. Also, a substrate W often has a notch in its outer periphery to help with pre-alignment of the substrate. The area around the notch can be difficult to coat with other technologies. However, this is easily achieved with jetting because of its good control.

Figure 11:
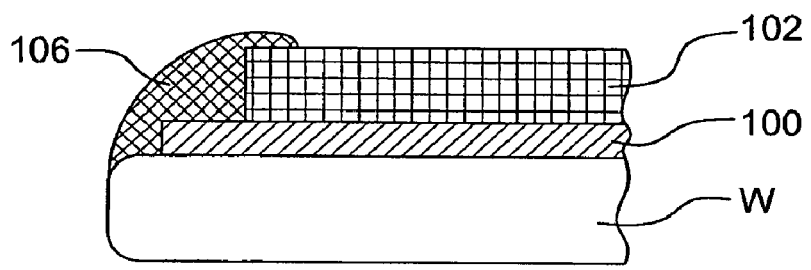
FIG. 11 depicts, in cross-section, a substrate in accordance with an embodiment of the invention.

FIGS. 8-12 illustrate embodiments of the sealing coating 106 in accordance with aspects of the present invention. Other geometries are possible, particularly regarding the shape of the sealing coaling 106. FIG. 11 shows an alternative in which the topcoat 104 is not present. The resist 102 may be a topcoat-less resist. The present invention should not be seen as being limited to the type or number of layers 100, 102, 104 on the substrate W or to the details of the edge of the substrate W. For example, an embodiment of the present invention may have the topcoat 104 not extend all the way over the resist 102. In that instance, the sealing coating 106 could be at an interface between the topcoat 104 and the resist 102 as well as or alternatively to being over the interface between the resist 102 and the BARC layer 100 and/or the BARC layer 100 and the substrate W. In an embodiment, the BARC layer 100 may not be present. Also, the arrangement of the edges of the various layers may change around the periphery of the substrate W. In an embodiment of the present invention it is not critical that the topcoat and resist land on the BARC or that the topcoat extends over the resist. This is because the sealing coating is strong enough and has good enough adherence that it can prevent an edge of the resist or topcoat from flaking off even if they are not adhered to the BARC.

The sealing coating 106 may be on an interface between any of the following two elements: BARC/substrate; resist/substrate; topcoat/substrate; BARC/resist; BARC/topcoat; and resist/topcoat. This list is non-exhaustive and should not be seen as limiting.

FIG. 7 illustrates an embodiment in which the edge of the topcoat layer 104 extends beyond the edge of the resist layer 102 so that the topcoat layer is on the BARC layer 100. However, the topcoat layer 104 does not extend beyond the edge of the BARC layer 100. In this embodiment, a sealing coating 106 is present at an edge of the substrate W. The sealing coating 106 covers an interface between the BARC layer 100 and the substrate W. The sealing coating 106 also covers an interface between the BARC layer 100 and the topcoat 104. The amount of material used in the sealing coating 106 (in the form of a single band) is minimized.

The sealing coating, as is illustrated in FIG. 7, is shown as being a single piece or band (which extends around the whole periphery of the substrate). This is not necessarily the case. For example, two bands of sealing coating could be present around the periphery of the substrate. That is, one band would be present on the interface between the substrate W and the BARC layer 100. The other band would be present between the BARC layer 100 and the topcoat layer 104. Furthermore, the sealing coating 106 may not be continuously present around the periphery. For example, it may not be necessary to have a sealing layer in certain orientations of the substrate. For example, it may not be necessary to have the sealing coating 106 present at positions at which the edge of the layers are perpendicular to non scanning directions.

FIG. 8 shows an embodiment in which the amount of material in the sealing coating is greater than in the embodiment illustrated in FIG. 7. This allows the cross-sectional profile of the edge of the substrate to be smoothed. This may help the flow of immersion liquid over the substrate.

FIG. 9 shows an embodiment in which the sealing coating 106 is only present on the interface between the topcoat layer 104 and the BARC layer 100. In this embodiment the sealing coating 106 is profiled to smooth the step between the BARC layer 100 and the topcoat layer 104. Furthermore, the sealing coating 106 extends at least partly up the edge of the topcoat layer 104. In fact, the sealing coating 106 extends all the way up the edge of the topcoat layer 104.

FIG. 10 shows an embodiment in which the sealing coating 106 only covers the interface between the BARC layer 100 and the substrate W. The sealing coating 106 is made to have the same height as the height of the BARC layer 100. During manufacture of the embodiment of FIG. 10, the sealing coating 106 could be applied immediately after the BARC layer 100 or immediately before application of the resist layer 102 or topcoat layer 104. The sealing layer 106 could be applied in a final step or just after the application of the resist layer 102 or topcoat layer 104.

FIG. 11 shows an embodiment in which no topcoat is present, so that the resist 102 may be a topcoat-less resist. Such a resist may have a highly lyophobic, e.g. hydrophobic, surface for the immersion liquid. In this embodiment the sealing coating 106 is present over the interface between the BARC layer 100 and the substrate W. The sealing coating 106 is also present on the interface between the resist layer 102 and the BARC layer 100. As can be seen, the sealing coating 106 extends beyond the top surface of the resist layer 102.

Figure 12:
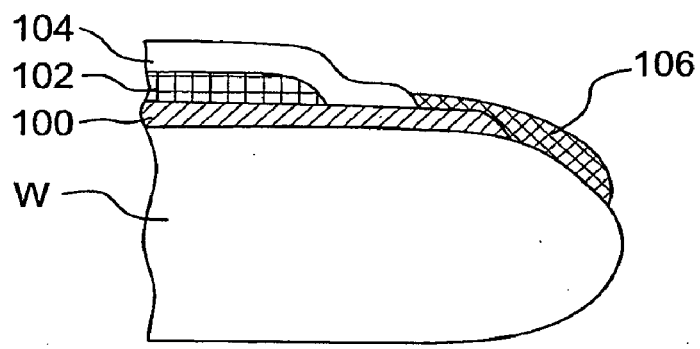
FIG. 12 depicts, in cross-section, a substrate in accordance with an embodiment of the invention.

FIG. 12 shows an embodiment that is similar to the embodiments of FIG. 7 and FIG. 8. As can be seen in FIG. 12, the sealing coating 106 extends a good way down the edge of the substrate W. For example, the sealing coating 106 could extend between one tenth and one half the way down the edge of the substrate. In an embodiment, the sealing coating 106 extends between one fifth and two fifths the way down the edge of the substrate W. In one embodiment the sealing coating substantially covers the edge of the substrate W. The sealing coating in an embodiment may cover any distance down the edge of the substrate W and such distance may be the same or different around the entire peripheral edge of the substrate.

In the embodiment of FIG. 12, the thickness of the sealing coating 106 varies through its cross-section. Furthermore, the sealing coating 106 does not extend to the top of the topcoat layer 104 and is not as high as the top of the resist layer 102. However, the transition from substrate W to the topcoat layer 104 is smoother than the step profile present when the sealing coating is absent.

Figure 13:
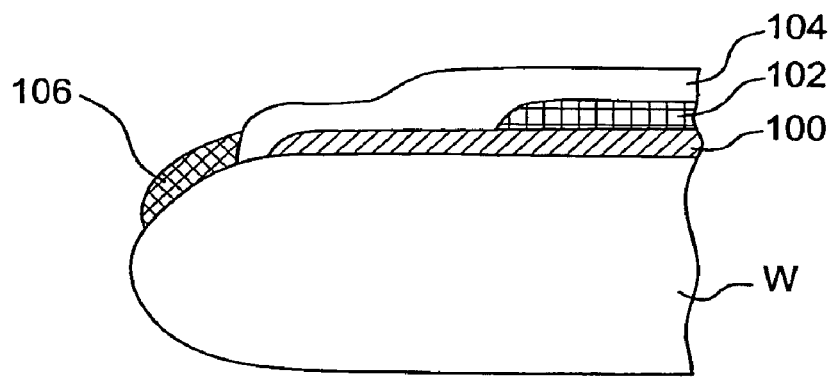
FIG. 13 depicts, in cross-section, a substrate in accordance with an embodiment of the invention.

As discussed above, an embodiment of the present invention allows non-ideal layer edge arrangements. As shown in FIG. 13, the topcoat layer 104 may extend over the resist 102 and BARC 100 layers onto the substrate W. This is not a problem because the sealing coating 106 is applied on the interface between the substrate W and the topcoat 104. Thus, as can be seen, less care is needed when applying the BARC 100, resist 102 and topcoat 104 layers. Other arrangements of the edges of the layers are also possible.

Figure 14:
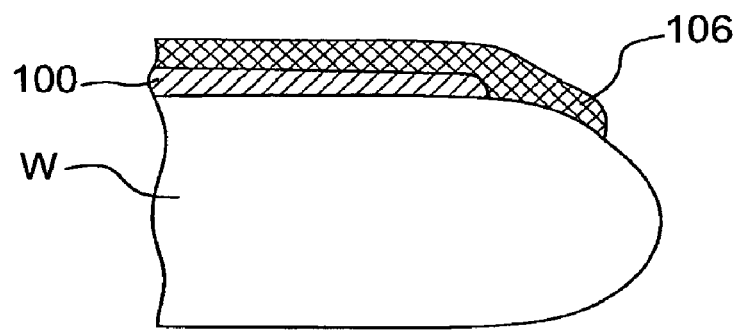
FIG. 14 depicts, in cross-section, a substrate in accordance with an embodiment of the invention.
Figure 15:
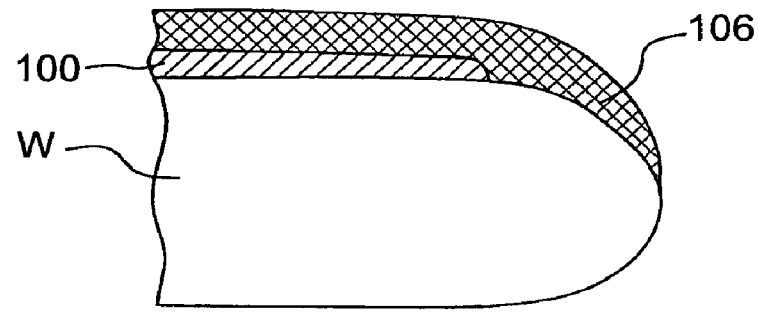
FIG. 15 depicts, in cross-section, a substrate in accordance with an embodiment of the invention.
Figure 16:
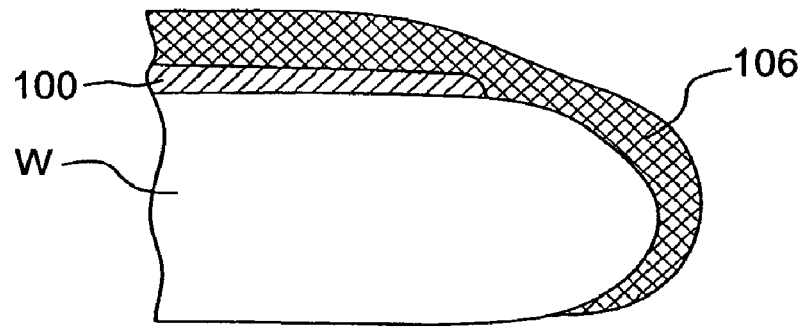
FIG. 16 depicts, in cross-section, a substrate in accordance with an embodiment of the invention.

Some other arrangements are shown in FIGS. 14 to 16 which show embodiments of the sealing coating 106. Each of these embodiments is a variation of the embodiment shown in FIG. 11 in that the sealing coating extends to the edge of the substrate W. However, as shown in FIG. 14, the sealing coating 106 is an integral part of the resist as shown in FIG. 14. The sealing coating 106 is resist and may be a topcoat-less resist. The sealing coating may be lyophobic, e.g., hydrophobic. In FIG. 15 the sealing coating 106 extends onto the edge of the substrate W. In FIG. 16, the sealing coating 106 extends onto the edge of the substrate W to substantially cover the entire edge. In variations, any intermediate extent of the edge may be covered. In one variation of the embodiments shown in FIGS. 14 to 16, the sealing coating substantially covers a side of the substrate, to cover the central portion of the substrate. In an embodiment, the sealing coating in the form of resist comprises different regions having different process treatments. For example, relative to the central region of the resist, the sealing coating region of the resist is treated to increase the adhesion of the resist to the substrate W and/or the BARC layer 100. Such a treatment may be a lower baking temperature. The treatment may be the addition of a chemical additive. For example, baking may be at the same temperature as for resist and/or topcoat which may normally be in the range of 90 to 100 degrees Celsius.

FIGS. 17 and 18 illustrate schematically how the sealing coating 106 may be applied using a jet. FIGS. 17 and 18 also illustrate how a sealing coating measurement apparatus can check whether or not the sealing coating 106 is present and, if it is present, whether it has been correctly applied (i.e. whether or not it has any defects).

FIG. 17 illustrates a stand alone (off-line) embodiment in which a stand alone sealing coating applicator and measurement unit 30 is provided. A track 35 leads from a substrate pre-processing unit to the applicator and measurement unit 30. Another track 36 takes the substrate W to the lithographic apparatus LA from the applicator and measurement unit 30. A final track 37 takes the substrate W away from the lithographic apparatus LA.

FIG. 18 illustrates an embodiment in which the sealing coating is applied and measured in the lithographic apparatus LA. This embodiment may be regarded as being in-line.

Other arrangements may be possible. For example, the sealing coating 106 could be applied upstream of track 35 and measured either before entering the lithographic apparatus LA or measured once inside the lithographic apparatus LA.

In FIG. 17, the substrate W is mounted on a substrate handler 50 which is adapted to spin the substrate W (illustrated by arrow 52) under the control of a controller 51 in a plane co-planar with the substrate W. A jet 40 applies droplets of material onto the edge of the substrate W as it spins on the substrate handler 50 to form a sealing coating 106 using jetting technology as described above. The jet 40 is controlled by controller 41. The controller 41 can also send control signals (or receive signals) from the controller 51 of the substrate handler 50. The controller 41 of the jet 40 also receives information from a sensor 42. The sensor 42 detects the droplets which are emitted by the jet 40. A radiation source 43 may be provided to illuminate the droplets. The radiation source 43 may be a light source. The sensor 42 may be a video camera. Signals from the sensor 42 are fed back to the controller 41. The controller 41 can control the jet 40, or instruct the controller 51 of the substrate handler 50, or both control the jet 40 and instruct controller 51 of the substrate handler 50 to vary parameters, as necessary. For example, a feedback loop could be used. Alternatively or additionally a feedforward loop could be used if the controller 51 of the substrate handler 50 provides information to the controller 41. A user interface 70 may be provided for overall user control of the process.

Also present in the sealing coating applicator and measurement unit 30 is a detector 60 and a radiation source 61. The radiation source 61 may be a light source. The source 61 illuminates the sealing coating 106 so that the detector 60 can measure reflected radiation. The detector 60 detects the presence or otherwise of the sealing coating 106 on the edge of the substrate W. The detector 60 may detect defects in the sealing coating 106. For example, the sealing coating 106 may have been applied such that it does not overlap the edges of the correct layers 100, 102, 104 around the entire periphery of the substrate W. A controller 62 is provided to control the detector 60 and to receive signals from the detector 60. The controller 62 comprises a memory 63 and a processor 64. The processor 64 may indicate to a user that the sealing coating 106 is present, is not present or defective or take other action (such as rejecting a substrate W) if the presence of a sealing coating 106 is not detected or if a defect in the sealing coating 106 is detected. The controller 62 sends control signals to, or receives control signals from, the controller 51 of the substrate handler 50. Furthermore, the controller 62 is connected to the user interface 70. The detector 60 may comprise a video camera. Another sensor which could be used is a dark/bright field detector, a capacititive sensor, a CCD sensor or a proximity sensor.

The radiation sources 43 and 61 can be of any wavelength which does not expose the resist 102. For example, visible light may be used.

An advantage of the detector 60 is that a substrate W which has not been processed properly can be rejected, thereby avoiding contamination of the lithographic apparatus LA. A negative result from the detector 60 (e.g., that the sealing coating 106 is not present or the sealing coating 106 is defective) could result in, for example, re-direction of the substrate W being measured away from the lithographic apparatus LA and selection of a new substrate W. Alternatively or additionally, the substrate W could be directed to a sealing coating applicator station for application of a sealing coating 106.

FIG. 18 shows an embodiment in which the sealing coating applicator and measurement unit 30 is provided in the lithographic apparatus LA itself. The detector 60 and jet 40 are the same as described with relation to the FIG. 17 embodiment. However, the substrate handler 50 may be the pre-aligning unit which is present in any case in a lithographic apparatus LA. After pre-alignment (and application and/or measurement of the sealing coating 106), the substrate W is transferred to a first substrate table WT1. The substrate W is taken by that first substrate table WT1 to a measuring unit MS for measurement (leveling) of the substrate W before being taken under the projection system PS and liquid confinement structure IH to be exposed. During, for example, exposure, a second substrate can be measured at the measurement stage MS on a second substrate table WT2.

In an embodiment, an additive may be added to the material of the sealing coating 106 so that the presence of the sealing coating 106 is easier to detect.

In a first aspect, there is provided a substrate for use in a lithographic projection apparatus, the substrate comprising a sealing coating that covers at least a part of a first interface between two layers on the substrate, or between a layer and the substrate, and does not extend to a central portion of the substrate. Optionally, in the first aspect the sealing coating further covers at least part of a second interface between two layers on the substrate or between a layer and the substrate, the second interface being different to the first interface. Optionally, in the first aspect as an outer layer, the substrate comprises a topcoat. Desirably the first interface is between the topcoat and a layer directly underneath the topcoat or between the topcoat and the substrate. Optionally, in the first aspect one of the layers comprises a resist layer. Desirably the first interface is between the resist layer and a layer directly adjacent the resist layer or between the resist layer and the substrate. Optionally, in the first aspect one of the layers comprises a bottom anti-reflection coating. Desirably the first interface is between the bottom anti-reflection coating and the substrate or between the bottom anti-reflection coating and a layer above the bottom anti-reflection coating. Optionally, in the first aspect the sealing coating comprises of at least one material selected from the following: a conformal coating, an acrylic coating, a silicone based coating, a modified topcoat coating, a modified resist coating, or a primer. Optionally, in the first aspect an edge of the sealing coating extends to an edge of the substrate. Desirably an edge of the sealing coating extends onto an edge of the substrate. Desirably an edge of the sealing coating extends to cover substantially an edge of the substrate. Optionally, in the first aspect the sealing coating smoothes, the cross-sectional profile of the substrate. Optionally, in the first aspect the sealing coating has better adhesion to the substrate than the layer(s). Optionally, in the first aspect the sealing coating is removable without damage to the layer(s).

In a second aspect, there is provided a method of preparing a substrate for lithography, the method comprising: applying one or more layers on the substrate; and applying a sealing coating to cover at least a part of an interface between two layers on the substrate, or between a layer and the substrate, without extending to a central portion of the substrate. Desirably the applying is performed by applying a non-continuous fluid flow to the substrate.

In a third aspect, there is provided a device manufacturing method comprising: applying a sealing coating to cover at least a part of an interface between two layers on a substrate, or between a layer and the substrate, without extending to a central portion of the substrate; and projecting a patterned beam of radiation onto a target portion of the substrate. Desirably the method further comprises detecting the presence of and/or defects in the sealing coating prior to the projecting. Desirably the beam of radiation passes through an immersion liquid on a top surface of the substrate.

In a fourth aspect, there is provided a substrate for use in a lithographic projection apparatus, the substrate comprising a sealing coating that covers at least a part of a first interface between a layer and the substrate, wherein the sealing coating extends to the edge of the substrate. Optionally, in the fourth aspect the sealing coating extends onto the edge of the substrate. Desirably the sealing coating extends to cover substantially all of the edge of the substrate. Optionally, in the fourth aspect the sealing coating comprises resist. Desirably the sealing coating comprises topcoat-less resist. Optionally, in the fourth aspect the sealing coating covers substantially one side of the substrate. Optionally, in the fourth aspect the sealing coating has a receding contact angle between 70 to 90 degrees. Desirably the receding contact angle is between 80 to 85 degrees.

In a fifth aspect, there is provided a method of preparing a substrate for lithography, the method comprising: applying a layer on the substrate; and applying a sealing coating to cover at least a part of an interface between the layer and the substrate, the sealing coating extending to an edge of the substrate.

In a sixth aspect, there is provided a device manufacturing method comprising: applying a sealing coating to cover at least a part of an interface between a layer and the substrate, the sealing coating extending to an edge of the substrate; and projecting a patterned beam of radiation onto a target portion of the substrate.

In a seventh aspect, there is provided a sealing coating applicator to apply a sealing coating to cover at least a part of an interface between a substrate and a layer on the substrate such that the sealing coating extends to an edge of the substrate, the sealing coating applicator comprising: a jet to dispense a non-continuous flow of fluid to form the sealing coating; and a substrate handler to move the substrate.

In an eighth aspect, there is provided a sealing coating measurement apparatus to detect presence of and/or a defect in a sealing coating of a substrate, the sealing coating measurement apparatus comprising: a detector to detect radiation reflected by the sealing coating; and a substrate handler to move the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or a data storage medium (e.g. semiconductor memory, magnetic or optical disk) having such a computer program stored therein. At least one controller may be provided to control the apparatus. One or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs. Each controller may operate at least a component of the apparatus according to the one or more of the computer programs embodying the invention.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. The one or more controlling elements can be provided to control the apparatus. The controller may have a processor which may operate to execute the one or more computer programs.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

The invention claimed is:

1. A substrate for use in a lithographic projection apparatus, the substrate comprising a topcoat-less resist coating covering at least a part of an interface between a layer and the substrate, wherein an edge of the coating extends outward of a location where a surface of the substrate on which the layer is provided transitions away from being generally planar.

2. The substrate of claim 1, wherein the layer comprises a bottom anti-reflection coating.

3. The substrate of claim 1, wherein the coating has better adhesion to the substrate than the layer.

4. The substrate of claim 1, wherein the coating substantially covers the planar surface of the substrate.

5. The substrate of claim 1, wherein the coating is lyophobic.

6. The substrate of claim 1, wherein the coating comprises different regions having had different process treatments.

7. The substrate of claim 6, wherein the different process treatment is a lower baking temperature.

8. The substrate of claim 6, wherein the different process treatment is the addition of a chemical additive.

9. The substrate of claim 1, wherein the edge of the coating extends down the edge of the substrate to a location at or past about half the width of the substrate.

10. A substrate for use in a lithographic projection apparatus, the substrate comprising a coating that covers at least a part of an interface between a topcoat-less resist layer and the substrate and does not extend to a central portion of the substrate.

11. The substrate of claim 10, wherein the coating comprises a topcoat-less resist.

12. The substrate of claim 10, further comprising a bottom anti-reflection coating between the resist layer and the substrate and the coating covering at least a part of an interface between the bottom anti-reflection coating and the substrate.

13. The substrate of claim 10, wherein an edge of the coating extends outward of a location where a surface of the substrate on which the resist layer is provided transitions away from being generally planar.

14. The substrate of claim 10, wherein the coating comprises of at least one material selected from the following: an acrylic coating, a silicone based coating, a modified topcoat coating, a modified resist coating, or a primer.

15. The substrate of claim 10, wherein an edge of the coating extends down the edge of the substrate to a location at or past about half the width of the substrate.

16. A method, comprising:
applying a layer on a lithographic substrate; and
applying a topcoat-less resist coating to cover at least a part of an interface between the layer and the substrate, wherein an edge of the coating extends outward of a location where a surface of the substrate on which the layer is provided transitions away from being generally planar.

17. The method of claim 16, further comprising projecting a patterned beam of radiation onto a target portion of the substrate and detecting presence of and/or a defect in, the sealing coating prior to the projecting.

18. The method of claim 16, wherein applying the sealing coating comprises dispensing a non-continuous flow of fluid to form the sealing coating and moving the substrate during the dispensing.

19. The method of claim 16, further comprising detecting presence of and/or a defect in the sealing coating by detecting radiation reflected by the sealing coating while moving the substrate.

20. The method of claim 16, wherein the coating is applied so as not to extend to a central portion of the substrate.

* * * * *